US009620205B2

(12) United States Patent
Nardi et al.

(10) Patent No.: US 9,620,205 B2
(45) Date of Patent: Apr. 11, 2017

(54) ALL AROUND ELECTRODE FOR NOVEL 3D RRAM APPLICATIONS

(71) Applicant: Intermolecular Inc., San Jose, CA (US)

(72) Inventors: Federico Nardi, Palo Alto, CA (US); Sergey Barabash, San Jose, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 283 days.

(21) Appl. No.: 14/133,057

(22) Filed: Dec. 18, 2013

(65) Prior Publication Data

US 2015/0016178 A1 Jan. 15, 2015

Related U.S. Application Data

(60) Provisional application No. 61/844,529, filed on Jul. 10, 2013.

(51) Int. Cl.
*G11C 13/00* (2006.01)
*H01L 45/00* (2006.01)

(52) U.S. Cl.
CPC .......... *G11C 13/004* (2013.01); *G11C 13/003* (2013.01); *G11C 13/0007* (2013.01); *H01L 45/08* (2013.01); *H01L 45/1206* (2013.01); *H01L 45/146* (2013.01); *H01L 45/1675* (2013.01); *G11C 2213/52* (2013.01)

(58) Field of Classification Search
CPC G11C 13/0011; H01L 45/085; H01L 45/1608
USPC .............. 365/148; 257/3; 438/382
See application file for complete search history.

(56) References Cited

U.S. PATENT DOCUMENTS

| 7,952,136 | B2 | 5/2011 | Kito | |
|---|---|---|---|---|
| 2009/0272962 | A1* | 11/2009 | Kumar | H01L 45/08 257/4 |
| 2011/0310653 | A1 | 12/2011 | Kreupl | |
| 2012/0001148 | A1* | 1/2012 | Miller | H01L 27/2409 257/4 |
| 2012/0074374 | A1* | 3/2012 | Jo | H01L 45/085 257/4 |
| 2013/0026438 | A1* | 1/2013 | Wang | H01L 45/1233 257/4 |
| 2013/0294145 | A1* | 11/2013 | Sandhu | H01L 45/08 365/148 |

OTHER PUBLICATIONS

Baek et al.; Realization of Vertical Resisteive Memory VRRAM using cost effective 3D Process; Jan. 1, 2011; IEEE; Unknown.
Li et al.; Integration of Resistive Switching Memory Cell with Vertical Nanowire Transistor; Jan. 1, 2012; World Academy of Science, Engineering and Technology; Unknown.
Wong et al.; MetalOxide RRAM; May 2, 2012; IEEE; Unknown.
Haitao Sun et al.; Overcoming the Dilemma Between RESET Current and Data Retention of RRAM by Lateral Dissolution of Conducting Filament; Jul. 1, 2013; IEEE Electron Device Letters; Unknown.

* cited by examiner

Primary Examiner — Tri Hoang

(57) ABSTRACT

A resistive switching memory device can include three or more electrodes interfacing a switching layer, including a top electrode, a bottom electrode, and a side electrode. The top and bottom electrodes can be used for forming conductive filaments and for reading the memory device. The side electrode can be used to control the resistance state of the switching layer.

20 Claims, 17 Drawing Sheets

ALL AROUND ELECTRODE FOR NOVEL 3D RRAM APPLICATIONS

This application claims priority to U.S. Provisional Patent Application No. 61/844,529 entitled "All around electrode for novel 3D RRAM applications" filed on Jul. 10, 2013, which is incorporated herein by reference.

FIELD OF THE INVENTION

This invention relates generally to nonvolatile memory elements, and more particularly, to methods for forming resistive switching memory elements used in nonvolatile memory devices

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, there can still be issues related to the implementation of practical nonvolatile memory devices. For instance, a high power forming process is needed to create conductive filaments before the memory devices can be used. In addition, there can be significant variability in the programming voltages or programming currents, which are required to switch the resistance of the switching layer. Further, high power can be required for reset operation in resistive memory devices.

Therefore, there is a need for a memory device that can meet the design criteria for advanced memory devices.

SUMMARY

In some embodiments, methods and devices for forming resistive memory devices are provided. The memory structure can include an insulator layer disposed between three or more electrodes, such as a top electrode, a bottom electrode, and a side electrode.

The insulator layer can be disposed between a top electrode and a bottom electrode in a lateral direction, e.g., the top electrode can be disposed on the insulator layer, which is disposed on the bottom electrode. The top and bottom electrodes can be used to read the resistance of the insulator layer, for example, by measuring a current through the insulator layer after a read voltage is applied to the two electrodes.

A side electrode can be disposed on a side surface of the insulator layer. The side electrode can impose an electric field to the charged defects in the insulator layer, driving the charged defects to form conductive filaments to change the resistance of the insulator layer. In some embodiments, the side electrode can be formed surrounding the insulator layer, thus can confine the charged defects in a middle region of the insulator layer.

In some embodiments, set and reset operations of the memory devices can include grounding the top and bottom electrodes while applying a positive or a negative voltage to the side electrode. The electric field generated by the side electrode can control the diameter, and/or the density of the ions responsible for the conduction, of the conductive filaments in the insulator layer. For example, the metallic ions (M+) or oxygen ions (O−) responsible for the conduction can be moved under the influence of the electric field toward or from the conductive filaments.

The memory operations can have low power consumption, since the movements of charged ions occur in a lateral flow of current toward the side electrode. Data retention of the memory devices can potentially improve.

In some embodiments, the read operation can be performed by applying a voltage between the top and bottom electrodes while floating or grounding the side electrode. The read operation is thus able to sense the change in diameter and/or ion density of the conductive filaments, for example, by the change in the read current through the insulator layer.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
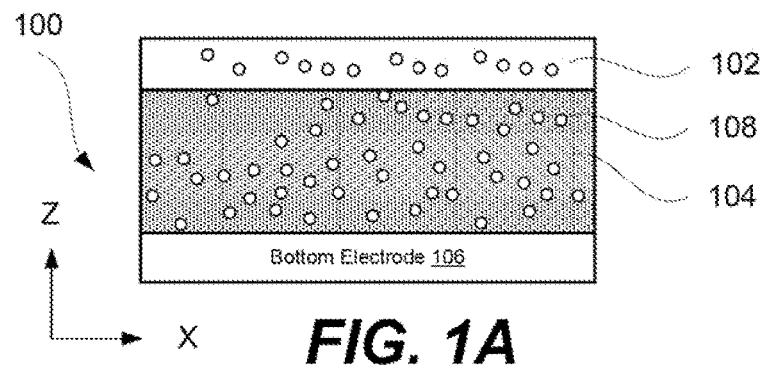
FIGS. 1A-1C illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods and resistive memory devices are provided in which the resistive memory devices can have a switching layer disposed between three or more electrodes, e.g., a top electrode, a bottom electrode, and one or more side electrodes. The top and bottom electrodes can be used for reading the memory devices. The side electrodes can be used for setting or resetting the memory devices, e.g., changing the resistance of the switching layer.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and an inert electrode that generally does not participate in oxygen transfer. The inert electrode may be referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relatively mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium is one example of an oxygen reactive material, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulator, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
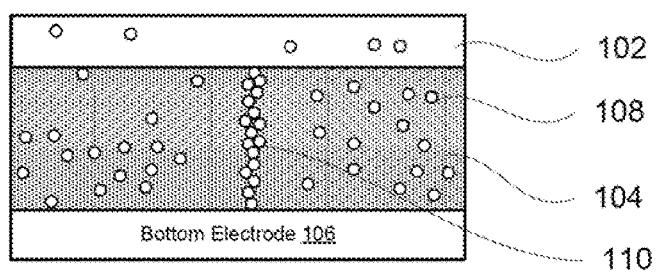
Figure 1C:
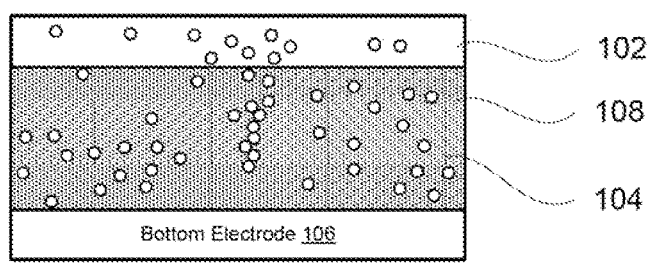

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices incorporating a ReRAM cell. As such, electrode 102 and 106 are generally formed from conductive materials. As stated above, one of the electrodes may be a reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types, all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIG. 2.

Figure 2:
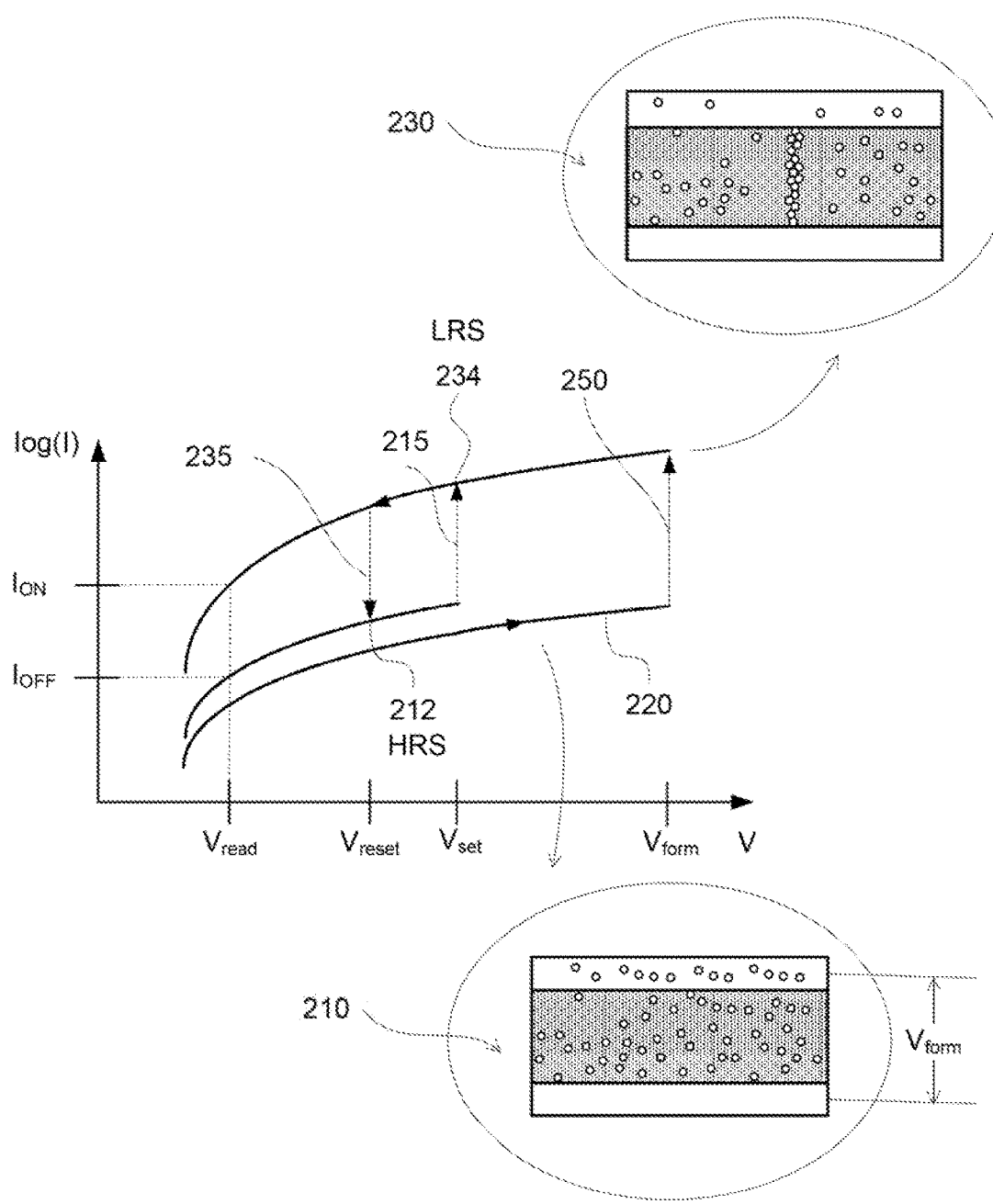
FIG. 2 illustrates a plot of a current passing through a unipolar ReRAM cell as a function of a voltage applied to the ReRAM cell according to some embodiments.

FIG. 2 illustrates a plot of a current passing through a unipolar ReRAM cell as a function of a voltage applied to the ReRAM cell according to some embodiments. A metal-insulator-metal (MIM) structure 210 can be first fabricated with an amount of defects embedded in the insulator layer. A voltage 220 can be applied to the MIM structure to form a resistive memory device from the MIM structure, for example, by making the insulator layer becoming a switching layer. By applying a forming voltage $V_{form}$, the randomly distributed defects can be transitioned 250 to lower resistance configurations, for example, in the form of filaments 230.

The lower resistance configurations can be characterized as a low resistance state (LRS) 234 for the resistive memory device, which persists even when the voltage is reduced. The LRS can represent a logic state of the memory device, such as a logic zero ("0").

At LRS, when another voltage, e.g., $V_{reset}$ is applied, the resistance can be transitioned 235 to a high resistance state (HRS), which persists even when the voltage is reduced. The HRS can represent another logic state of the memory device, such as a logic one ("1"). The reset voltage $V_{reset}$ is smaller than the forming voltage $V_{form}$.

At HRS, when another voltage, e.g., $V_{set}$ is applied, the resistance can be transitioned 215 back to the low resistance state (LRS), which persists even when the voltage is reduced. The set voltage $V_{set}$ is also smaller then the forming voltage $V_{form}$.

Overall, the ReRAM cell may be switched back and forth between its LRS and HRS many times. For example, when it is desired to turn "ON" the cell, e.g., to have a LRS, a set operation can be performed through the application of a set voltage $V_{set}$ to the electrodes. Applying the set voltage forms one or more conductive paths in the resistance switching layer as described above with reference to FIG. 1B. If it is desired to turn "OFF" the ReRAM cell, e.g., to change to HRS, a reset operation can be preformed through the application of a reset voltage $V_{reset}$ to the electrodes. Applying the reset voltage can destroy the conductive paths in the resistance switching layer as described above with reference to FIG. 1C.

The polarity of the reset voltage and the set voltage may be the same in unipolar memory devices, or may be different in bipolar devices (not shown). Without being restricted to any particular theory, it is believed that the resistive switching occurs due to filament formation and destruction caused by the application of electrical field.

Read operations may be performed in each of these states (between the switching operations) one or more times or not performed at all. During the read operation, the state of the ReRAM cell or, more specifically, the resistive state of its resistance of resistance switching layer can be sensed by applying a sensing voltage to its electrodes. The sensing voltage is sometimes referred to as a read voltage $V_{read}$.

In some embodiments, the set voltage $V_{set}$ is between about 100 mV and 10V or, more specifically, between about 500 mV and 5V. The length of set voltage pulses may be less than about 100 milliseconds or, more specifically, less than about 5 milliseconds and even less than about 100 nanoseconds. The read voltage $V_{read}$ may be between about 0.1 and 0.5 of the set voltage $V_{set}$. In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse may be comparable to the length of the corresponding set voltage pulse or may be shorter than the write voltage pulse. ReRAM cells should be able to cycle between LRS and HRS between at least about $10^3$ times or, more specifically, at least about $10^7$ times without failure. A data retention time should be at least about 5 years or, more specifically, at least about 10 years at a thermal stress up to 85° C. and small electrical stress, such as a constant application of the read voltage. Other considerations may include low current leakage, such as less than about 40 A/cm$^2$ measured at 0.5 V per 20 Å of oxide thickness in HRS.

In some embodiments, the memory device can be fabricated with the switching layer interfacing three or more electrodes. Top and bottom electrodes can be used to sense the resistance of the switching layer, while a side electrode can be used to control the resistance of the switching layer, for example, by controlling the characteristics of the conductive filaments through an electric field applied by the side electrode. The memory switching operations using the side electrode can potentially consume less power than using the top and bottom electrodes, for example, by lateral charge movements not along the direction of the conductive filaments. In addition, retention time can potentially be improved due to less disturbance of the conductive filaments.

Figures 3A, 3B:
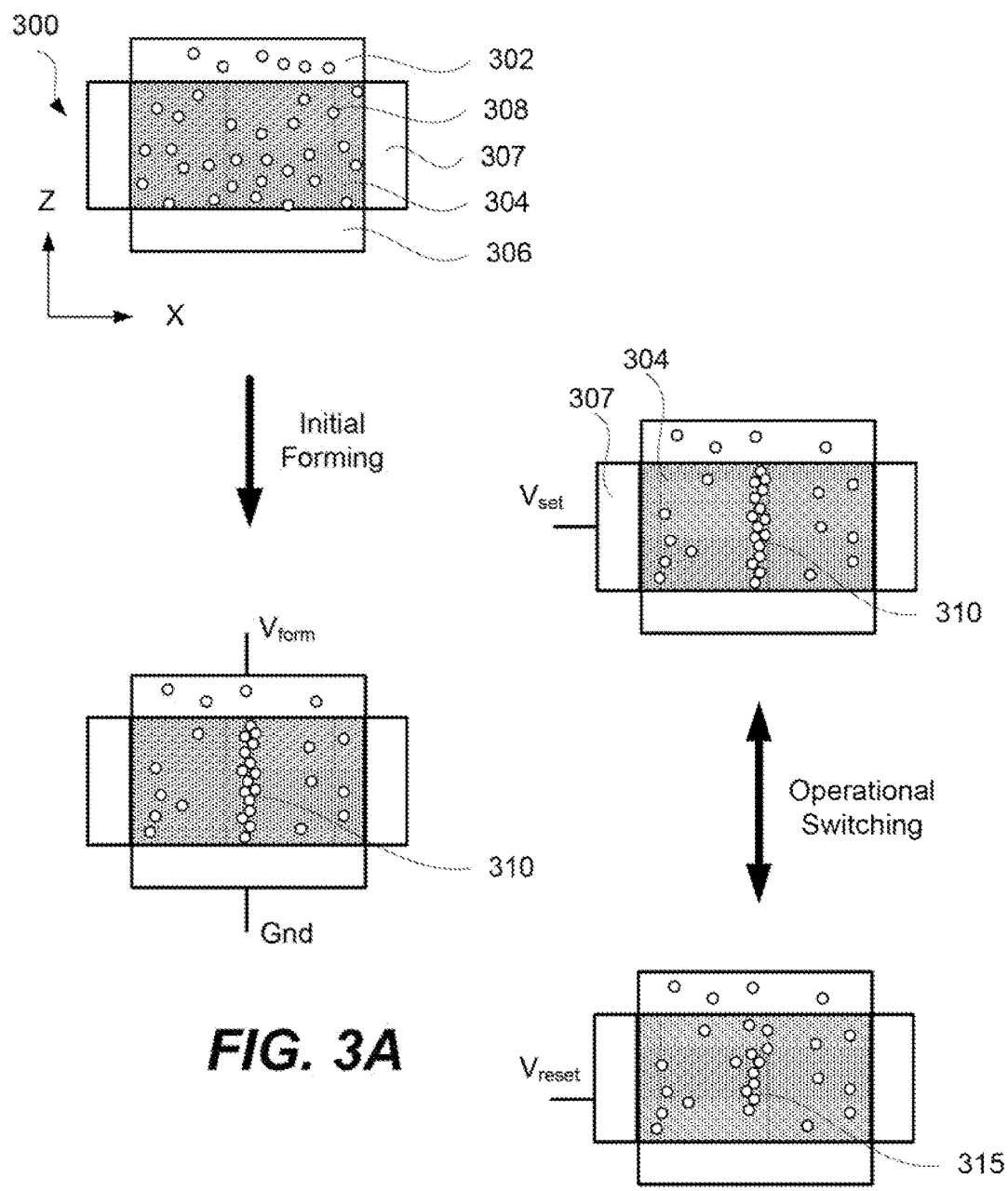
FIGS. 3A-3B illustrate a schematic representation of a ReRAM operation having three or more electrodes according to some embodiments.

FIGS. 3A-3B illustrate a schematic representation of a ReRAM operation having three or more electrodes according to some embodiments. A ReRAM cell 300 can include a resistance switching layer 304 provided between a top electrode 302, a bottom electrode 306, and one or more side electrodes 307. The top and bottom electrodes 302 and 306 can be disposed along a lateral direction of the switching layer 304, e.g., along the xy plane. The side electrodes can be electrically connected to each other, and can be disposed along a vertical direction of the switching layer 304, e.g., along the yz plane. The switching layer 304 can have defects 308, which can be randomly distributed in the switching layer 304.

FIG. 3A shows an initial forming operation of the memory cell 300. A forming voltage $V_{form}$ can be applied to the top electrode 302 to align the defects to form conductive filament 310 between the top and bottom electrodes 302 and 306. FIG. 3B shows the operation switching of the switching layer 304, which includes applying a set voltage $V_{set}$ or a reset voltage $V_{reset}$ to the side electrode 307.

The set operation, e.g., an application of a set voltage to the side electrode 307, can switch the layer 304 into a low resistance state, for example, by driving the defects to form conductive filament 310 between top and bottom electrodes 302 and 306. The reset operation, e.g., an application of a reset voltage to the side electrode 307, can switch the layer 304 into a high resistance state, for example, by driving away the defects to break the conductive filament 315.

Figure 4A:
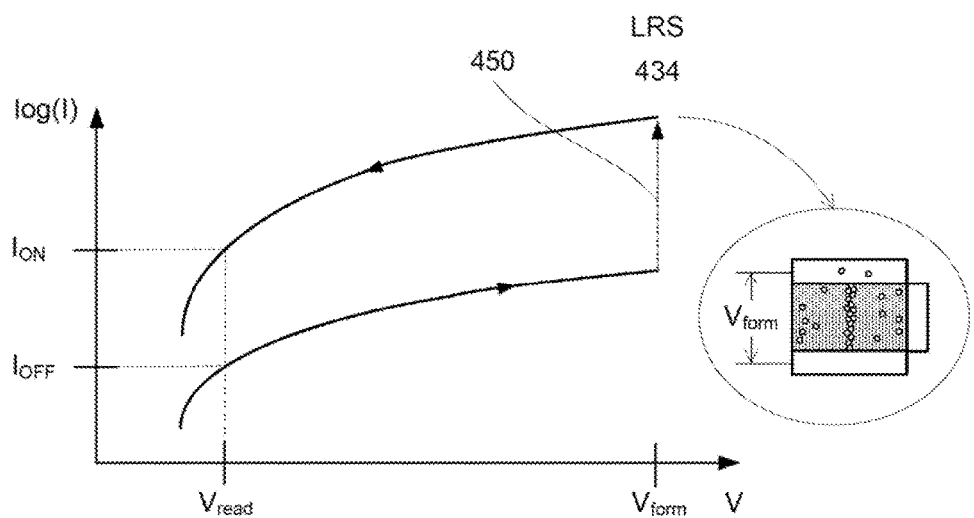
FIGS. 4A-4B illustrate plots of a current passing through a unipolar ReRAM cell having three or more electrodes according to some embodiments.
Figure 4B:
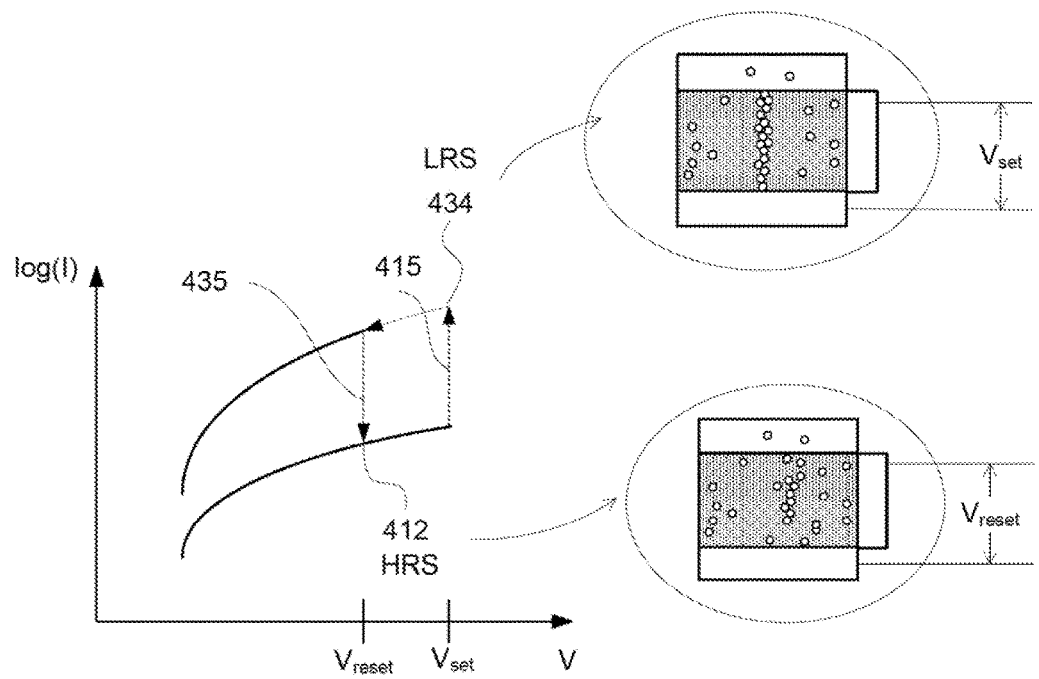

FIGS. 4A-4B illustrate plots of a current passing through a unipolar ReRAM cell having three or more electrodes according to some embodiments. A memory device can be first fabricated with the insulator layer disposed between three or more electrodes.

FIG. 4A shows an I-V characteristic of a voltage applied between the top and bottom electrodes of the memory device. A forming voltage $V_{form}$ can be applied between the top and bottom electrodes, making a transition 450 of the switching layer to a low resistance state (LRS) 434, characterized by the formation of conductive filaments connecting the two electrodes. A read voltage $V_{read}$ can be applied between the top and bottom electrodes, sensing the resistance state of the switching layer through a measurement of current I. High current $I_{ON}$ shows that the switching layer is at LRS and low current $I_{OFF}$ shows that the switching layer is at HRS.

FIG. 4B shows an I-V characteristic of a voltage applied between the side electrode and a reference electrode, such as the bottom electrode of the memory device. A reset voltage $V_{reset}$ can be applied between the side and bottom electrodes, making a transition 435 of the switching layer from a low resistance state (LRS) 434, characterized by the conductive filaments or by larger conductive filaments, to a high resistance state (HRS) 412, characterized by the broken conductive filaments or by smaller conductive filaments. A set voltage $V_{set}$ can be applied between the side and bottom electrodes, making a transition 415 of the switching layer from a high resistance state (HRS) 412, characterized by the broken conductive filaments or by smaller conductive filaments, to a low resistance state (LRS) 434, characterized by the conductive filaments or by larger conductive filaments.

In some embodiments, the conductive filaments can be connected (resulting in LRS) or broken (resulting in HRS). Alternatively, the conductive filaments can have different sizes, larger conductive filaments for LRS and smaller conductive filaments for HRS.

In some embodiments, the forming process to form conductive filaments can be performed by applying a voltage to the side electrodes instead of to the top and bottom electrodes.

Figure 5A:
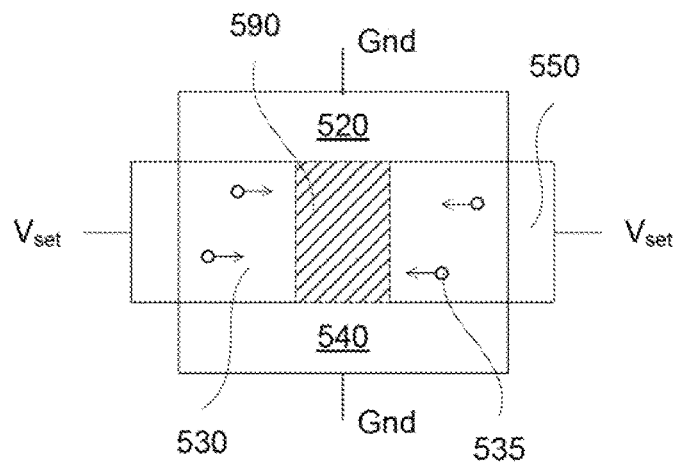
FIGS. 5A-5C illustrate a schematic behavior of a memory structure according to some embodiments.
Figure 5B:
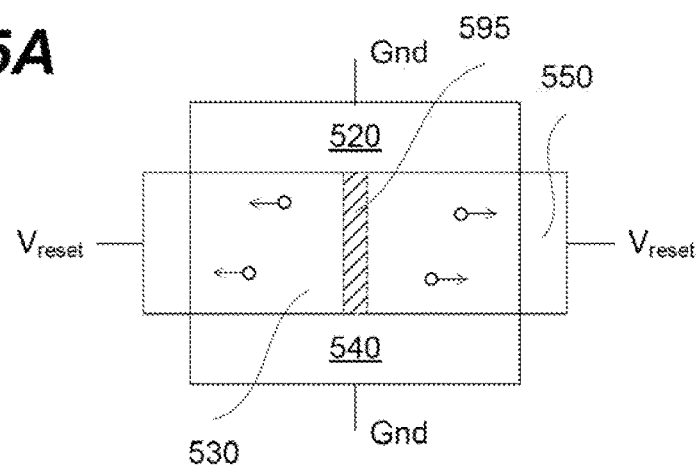
Figure 5C:
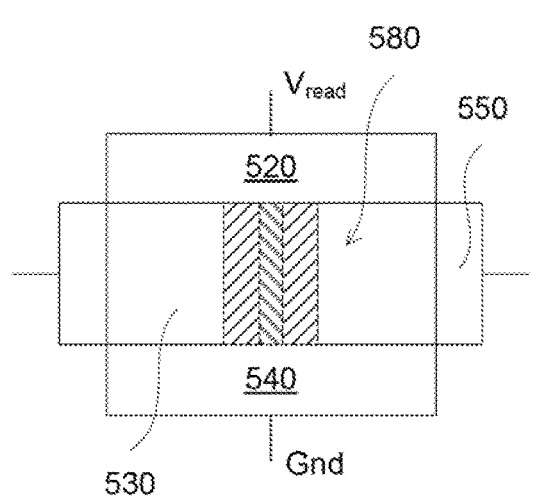

FIGS. 5A-5C illustrate a schematic behavior of a memory structure according to some embodiments. The described behavior is illustrated as a possible operating mechanism of the memory structure, and should not affect the validity of the present invention. Other mechanisms or variations of the described mechanism can be responsible for the memory behaviors.

A memory structure is shown, including a switching layer 530 disposed between a top electrode 520, a bottom electrode 540, and side electrodes 550. The side electrodes 550 can be electrically connected, for example, an all-around side electrode.

In FIG. 5A, a set voltage $V_{set}$ can be applied to the side electrodes 550, while keeping the top electrode 520 and the bottom electrode 540 at ground. The set voltage can establish an electric field across the switching layer 530, which can drive the conduction charges 535 away from the side electrodes 550 to accumulate to the conductive filament region 590. The accumulation of conductive charges can enlarge the conductive filament region 590, which can reduce a resistance across the top and bottom electrodes, leading to a low resistance state of the switching layer.

In some embodiments, the set voltage $V_{set}$ can be a positive voltage, such as a positive power supply $V_{dd}$. The positive voltage $V_{set}$ can drive the positive metal ions M+ toward the conductive filament region 590. The negative oxygen ions O− can be attracted toward the side electrodes.

In FIG. 5B, a reset voltage $V_{reset}$ can be applied to the side electrodes 550, while keeping the top electrode 520 and the bottom electrode 540 at ground. The reset voltage can establish an opposite electric field across the switching layer 530, as compared to the electric field established by the set voltage $V_{set}$. The opposite electric field can drive the conduction charges 535 away from the conductive filament region 590 to form a smaller size conductive filament region 595. The reduction of conductive charges can reduce the conductive filament region, which can also reduce the filament region into disconnected sections, which can increase a resistance across the top and bottom electrodes, leading to a high resistance state of the switching layer.

In some embodiments, the reset voltage $V_{reset}$ can be a negative voltage, such as a negative power supply $V_{ss}$. The negative voltage $V_{reset}$ can drive the positive metal ions M+ away the conductive filament region to form a smaller conductive filament region 595. The negative oxygen ions O− can be attracted toward the conductive filament region 595.

In FIG. 5C, a read voltage $V_{read}$ can be applied between the top and bottom electrodes 520 and 540. For example, a read voltage can be applied to the top electrode 520 while keeping the bottom electrode 540 at ground. The side electrodes 550 can be left float, e.g., not connected to the power source. Alternatively, the side electrodes can be grounded. The resistance of the switching layer 530 can be measured by sensing the current through the switching layer. The resistance of the switching layer can be determined by the size 580 of the conductive filament region, which can be controlled by the voltage applied to the side electrodes.

Figure 6A:
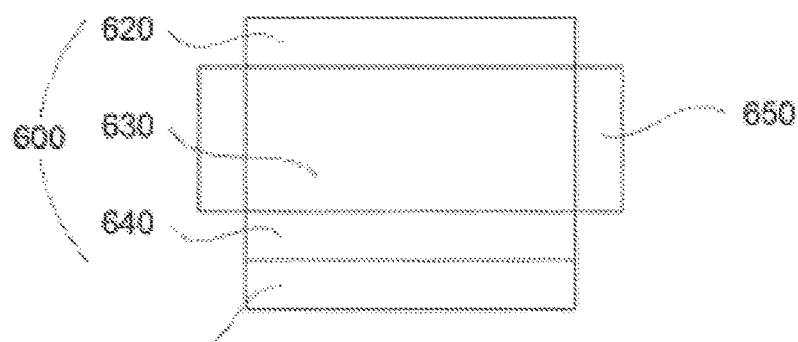
FIGS. 6A-6C illustrate various configurations of a memory structure according to some embodiments.
Figure 6B:
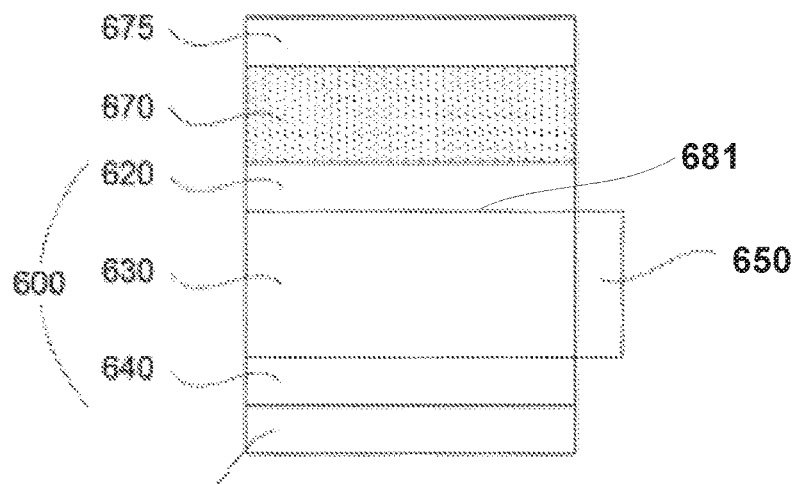
Figure 6C:
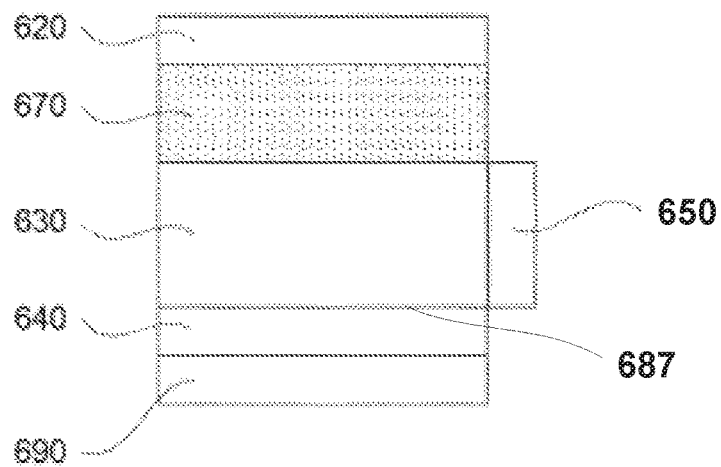

FIGS. 6A-6C illustrate various configurations of a memory structure according to some embodiments. Cross section views of a memory structure are shown, including a memory device 600 disposed on a substrate 690. The memory device can include a top electrode 620 disposed on an insulator layer 630, which is disposed on a bottom electrode 640. Side electrodes 650 can be provided at sides of the insulator layer 630. Other layers can be included, such as a current selector or a current limiter layer 670 and another electrode 675. The top electrode 620 can be disposed near the insulator layer 630. However, other configurations can be used, such as the top electrode 620 can be disposed on the current selector or current limiter layer 670.

In FIG. 6A, the insulator layer 630 can be in contact with the top and bottom electrodes, e.g., sharing a lateral interface with the electrodes. The side electrodes can be disposed on both sides of the insulator layer, or can be disposed around the insulator layer.

Other components can be included in the memory structure, such as a current steering element 670. In FIG. 6B, a current steering layer 670 can be disposed on the top electrode 620, together with an electrode 675 for the current steering layer 670. The insulator layer 630 can have a top lateral surface interfacing with a layer directly above the insulator layer. The insulator layer can have a bottom lateral surface interfacing with a layer directly below the insulator layer. For example, if the insulator layer 630 is formed on a bottom electrode 640, the insulator layer can have a bottom lateral surface 683 that interfaces with the bottom electrode 640. If the insulator layer 630 is formed under a top electrode 620, the insulator layer can have a top lateral surface 681 that interfaces with the top electrode 620.

In FIG. 6C, a current steering layer 670 can be disposed on the insulator 630, sharing the electrode 620 with the insulator layer 630. The insulator layer 630 can have a top lateral surface interfacing with a layer directly above the insulator layer. For example, if the insulator layer is formed under a current steering layer 670, the insulator layer 630 can have top lateral surface 685 that interfaces with the current steering layer 670. The insulator layer can have a bottom lateral surface interfacing with a layer directly below the insulator layer. For example, if the insulator layer 630 is formed on a bottom electrode 640, the insulator layer can have a bottom lateral surface 687 that interfaces with the bottom electrode 640.

In some embodiments, the insulator layer can include a layer of $TiO_2$, $HfO_2$, $ZnO_2$, strontium titanate (STO), indium gallium zinc oxide (IGZO), or $SnO_2$. The insulator layer can include a transition metal oxide. The insulator layer can have multiple lateral portions, e.g., parallel portions between two electrodes.

The thickness of the insulator layer can be between 5 and 25 nm. The electrodes can include Pt, Ru, Ti, TiN, Ag, Ni, Co, an alloy of these elements, or a conductive metal oxide of these elements. The two electrodes can have same composition elements, e.g., both electrodes can include Pt, or can have different composition elements, e.g., one electrode can include Pt and the other electrode Ru. The electrodes can have any thickness, such as between 5 and 500 nm.

Figure 7A:
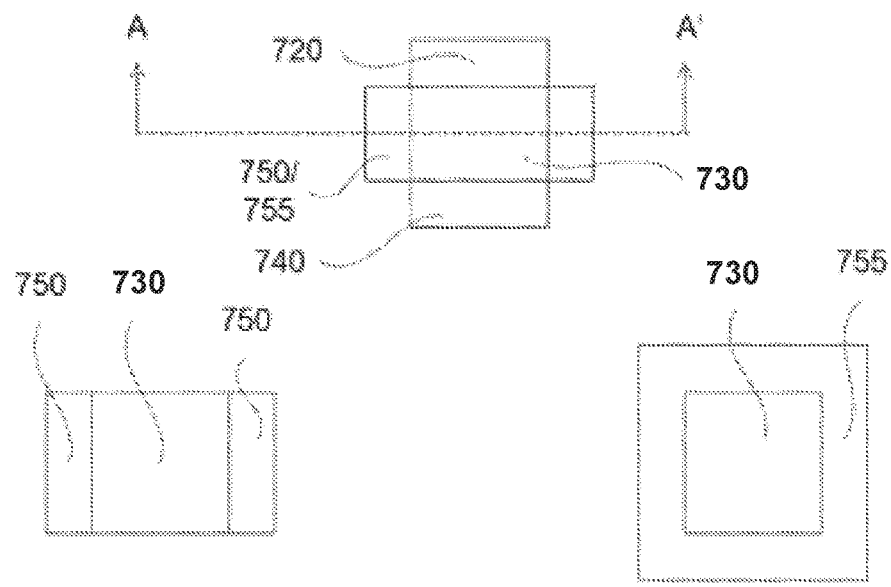
FIGS. 7A-7B illustrate various configurations of a memory structure having three or more electrodes according to some embodiments.
Figure 7B:
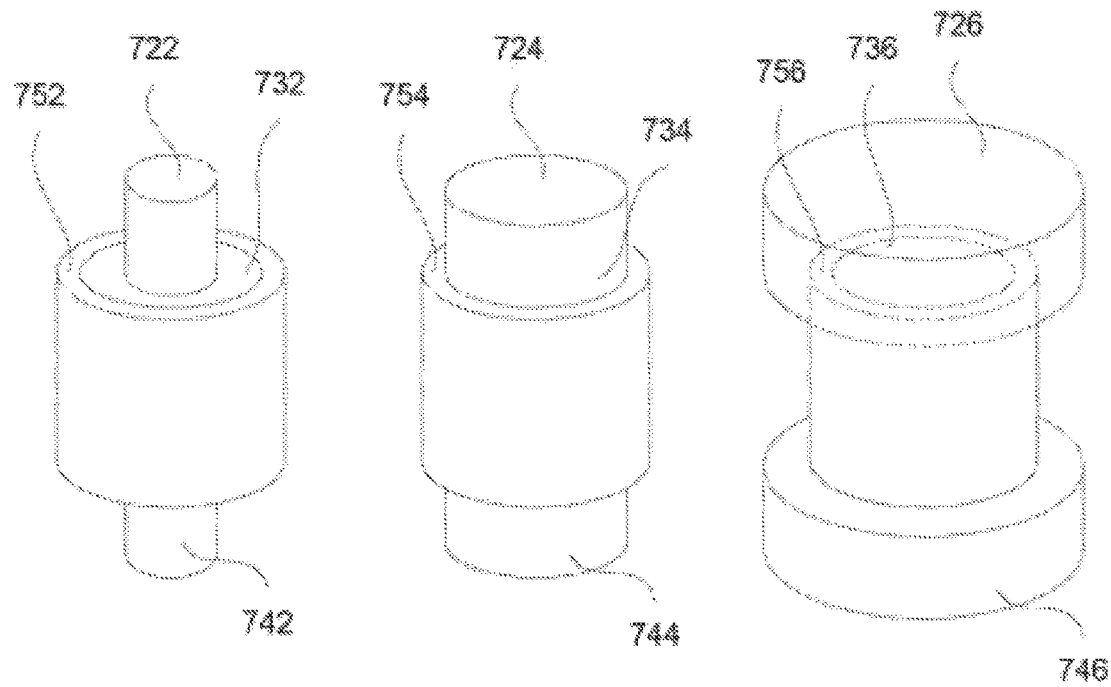

FIGS. 7A-7B illustrate various configurations of a memory structure having three or more electrodes according to some embodiments. In FIG. 7A, a memory structure can include a switching layer 730 disposed between electrodes 720, 740, and 750/755. Switching layer 730 can be placed between top electrode 720 and bottom electrode 740, which interface top and bottom lateral surfaces of the switching layer 730. Side electrodes 750/755 can be placed at side surfaces of the switching layer 730. Different cross sectional top views through line AA' of the memory structure are also shown, including side electrodes 750 disposed on two opposite sides of the switching layer, or side electrodes 755 disposed around the switching layer on all sides.

In FIG. 7B, perspective views of different memory structures are shown, including a side electrode surrounding a switching layer, with top and bottom electrodes smaller, equal, or larger than the switching layer. A memory structure can include a side electrode 752 surrounds a switching layer 732. Top electrode 722 and bottom electrode 742 can interface lateral surfaces of the switching layer 732. The lateral surfaces of the top and bottom electrodes can be smaller than that of the switching layer.

A memory structure can include a side electrode 754 surrounds a switching layer 734. Top electrode 724 and bottom electrode 744 can interface lateral surfaces of the switching layer 734. The lateral surfaces of the top and bottom electrodes can be about the same size as that of the switching layer.

A memory structure can include a side electrode 756 surrounds a switching layer 736. Top electrode 726 and bottom electrode 746 can interface lateral surfaces of the switching layer 736. The lateral surfaces of the top and bottom electrodes can be larger than that of the switching layer.

In some embodiments, methods and memory structure fabricated from the methods, are provided including forming a side electrode of a switching layer, together with top and bottom electrodes. The side electrode can switch a resistance state of the witching layer, for example, by controlling a size of the conductive filaments through the switching layer between the top and bottom electrodes.

Figure 8:
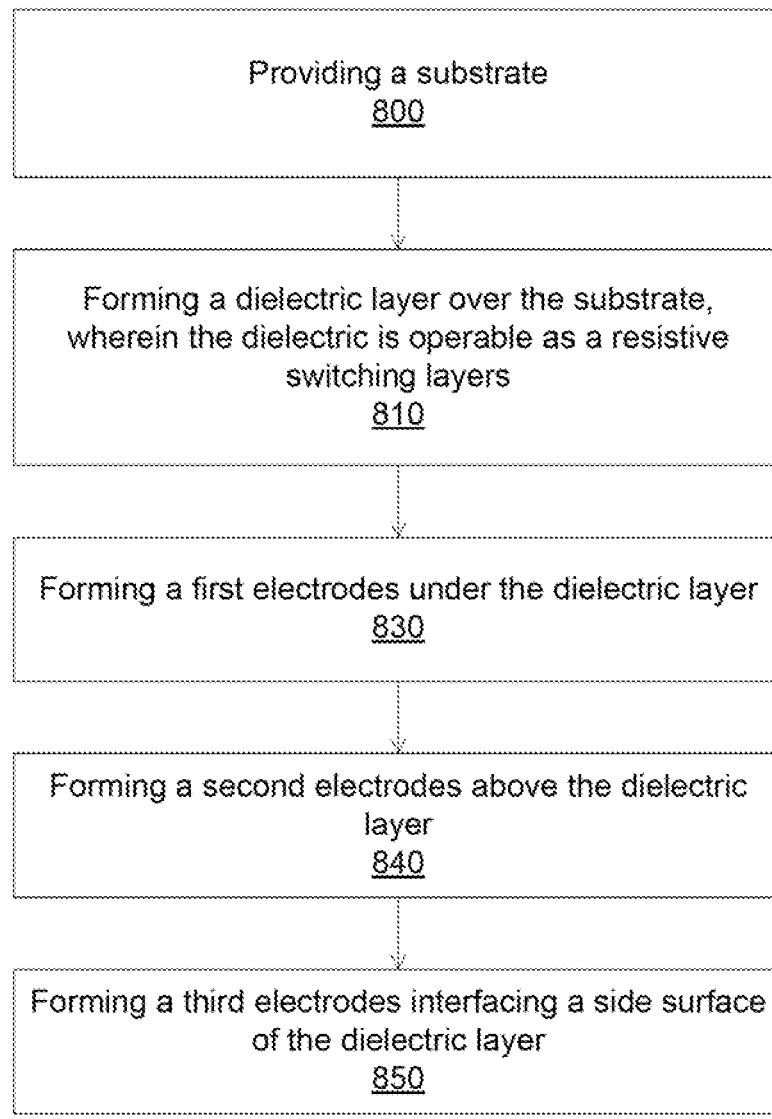
FIG. 8 illustrates a flowchart for forming a memory structure according to some embodiments.

FIG. 8 illustrates a flowchart for forming a memory structure according to some embodiments. The memory structure can include an insulator or dielectric layer disposed between three or more electrodes. The described flowchart is a general description of techniques used to form the memory devices described above. The flowchart describes techniques for forming a memory device generally including two electrodes and one or more layers disposed there between. Although certain processing techniques and specifications are described, it is understood that various other techniques and modifications of the techniques described herein may also be used.

In operation 800, a substrate is provided. The substrate can include a semiconductor substrate, or other types of substrates such as glass substrates or polymer substrates. The substrate can include other elements, layers, or devices that have been fabricated on the substrate. For example, current limiter or steering devices can be present on the substrate.

In operation 810, an insulator or dielectric layer can be formed over the substrate. The insulator layer can include a metal oxide such as $ZrO_2$, $HfO_2$, or $Al_2O_3$. The thickness of the insulator layer can be between 3 nm and 30 nm. The insulator can be operable as a switching layer for a resistive memory device. In some embodiments, the insulator layer can include any combinations of metal and metal oxide, chalcogenite and perovskite layers.

An optional treatment can be performed after depositing the insulator layer. The treatment can include a plasma treatment or a high temperature treatment. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the insulator layer can be deposited by a PVD or ALD process. For example, an ALD process can include $O_3$ oxidant, at about 250-300 C deposition temperature, using tetrakis (ethylmethylamino) zirconium (TEMAZ), Tris (dimethylamino) cyclopentadienyl Zirconium, tetrakis (ethylmethylamino) hafnium (TEMAHf), tetrakis (dimethylamido) hafnium (TDMAHf) precursors.

In operation 830, a first electrode layer can be formed under the insulator layer. For example, the first electrode can be formed before forming the insulator layer. The first electrode layer can be formed over a substrate, for example, a silicon substrate that may include one or more layers already formed thereon. In some embodiments, the first electrode layer can be a polysilicon layer or a metal containing layer. For example, the first electrode layer can be a highly doped polysilicon layer that is formed using a conventional chemical vapor deposition (CVD) or atomic layer deposition (ALD) type polysilicon deposition technique. In some cases, an optional native oxide layer removal step may be performed after forming the first layer by use of a wet chemical processing technique, or conventional dry clean process that is performed in a plasma processing chamber. It should be noted that the first electrode layer may be provided on a substrate that may have a resistive memory element and the electrode formed thereon as well. Alternatively, in the case where no other device is provided, the first electrode layer can be the bottom electrode. The first electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. For example, the first electrode can be sputtered by bombarding a metal target at 150-500 W with a pressure of 2-10 mTorr for a deposition rate of approximately 0.5-5Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, pulsed layer deposition (PLD), physical vapor deposition (PVD), CVD, evaporation, etc. can also be used to deposit the first electrode. In some embodiments, the first electrode is in contact with one of the signal lines. The first electrode may have any thickness, for example between about 5 nm and about 500 nm thick.

In operation 840, a second electrode layer can be formed over the insulator layer. The second electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. The second electrode can have any thickness, for example between about 5 nm and about 500 nm thick. Additional layers can be added, such as layers for a current selector or a current limiter device. Alternatively, the additional layers can be formed under the dielectric layer or under the first electrode.

In operation 850, a third electrode layer can be formed at a side of the insulator layer, such as around the insulator layer. The third electrode layer can include materials similar to those of the first or second electrode. After fabrication, the memory structure can be ready for operation, e.g., storing information by switching operations after a forming process.

FIGS. 9A-9E illustrate a fabrication process for forming a memory structure having an all-around side electrode according to some embodiments. The described process is a general description of techniques used to form the memory devices described above. Although certain processing techniques and specifications are described, it is understood that various other techniques and modifications of the techniques described herein may also be used.

Figure 9A:
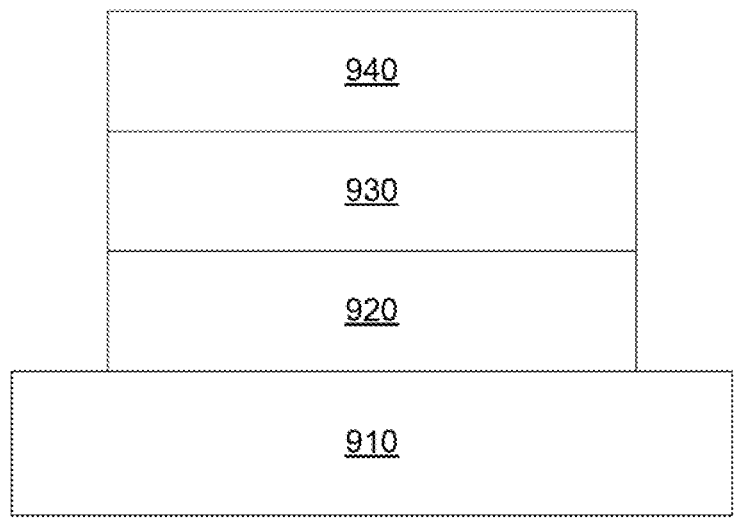
FIGS. 9A-9E illustrate a fabrication process for forming a memory structure having an all-around side electrode according to some embodiments.

In FIG. 9A, a top electrode 940 can be formed ever a switching layer 930, which can be formed over a bottom electrode 920, which can be formed over a substrate 910. The switching layer 930 can be a metal oxide, such as hafnium oxide or zirconium oxide. The switching layer can have embedded defects that can be re-distributed to form conductive filaments. A patterning process can be performed, for example by a photolithography process followed by a etch process, to pattern the memory stack, e.g., the switching layer between the two electrodes. Other process steps and components can be added, for example, a cleaning step and device isolation.

Figure 9B:
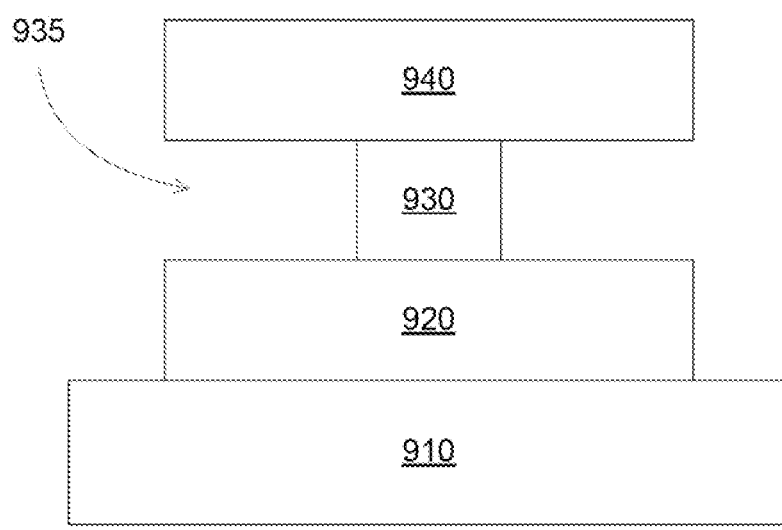

In FIG. 9B, the switching layer is selectively etched. For example, the switching layer can be selectively etched with respect to the two electrodes to remove a lateral portion and to form an opening 935 of the switching layer. The selective etch can be a wet etch, for example, using a solution of HF and HCl.

Figure 9C:
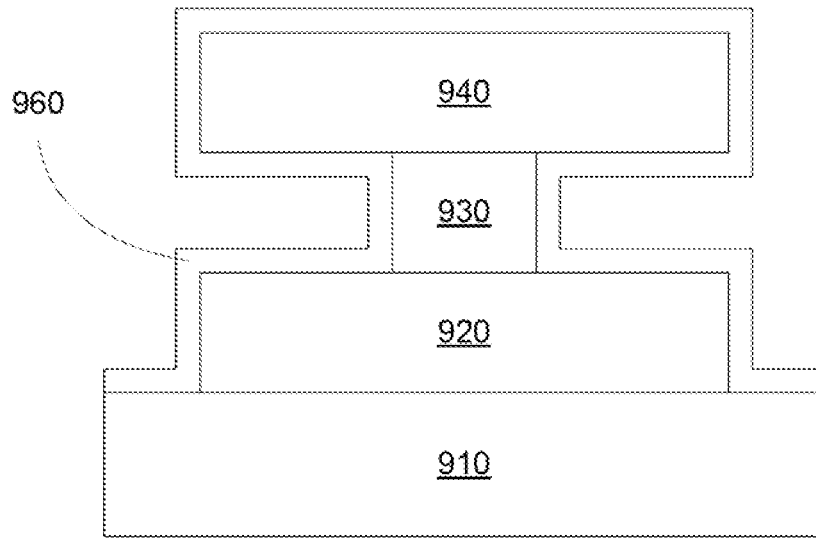

In FIG. 9C, a dielectric layer 960 is formed, insulating the top and bottom electrodes. The dielectric layer 960 can be thin, with a thickness less than 50%, or can be less than 30% or 20%, of the switching layer 930. The formation of the dielectric layer 960 can be performed by a deposition process that has good gap fill characteristics, such as an atomic layer deposition (ALD) process, to uniformly coating the opening 935. The dielectric layer 960 can be an insulator layer, such as silicon oxide layer or aluminum oxide layer.

Figure 9D:
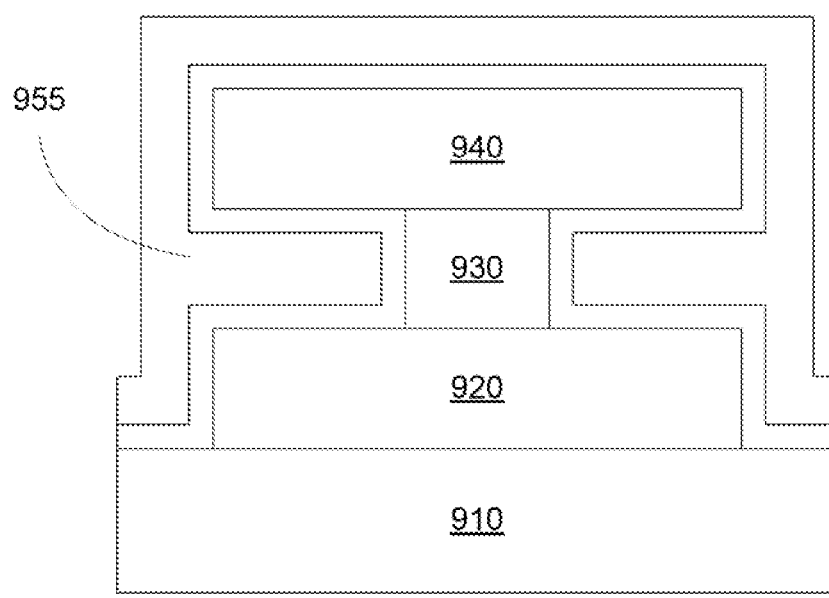
Figure 9E:
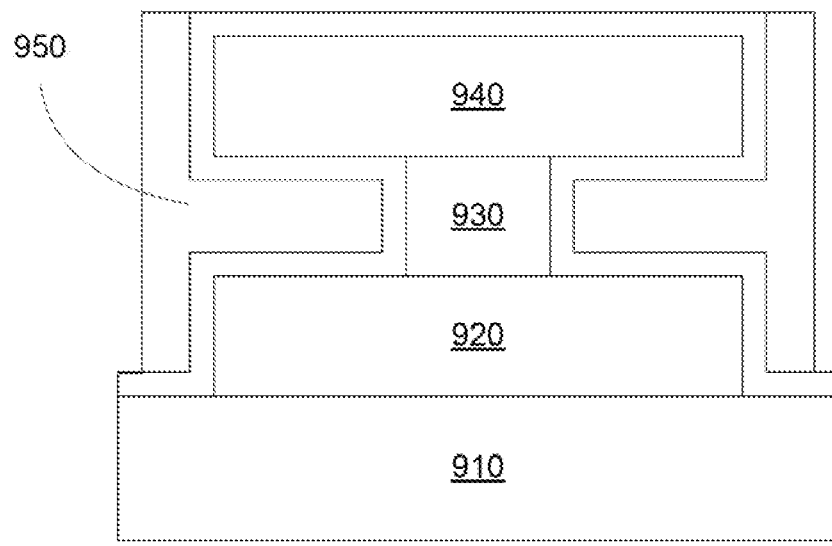

In FIG. 9D, a conductive layer 955 can be formed over the dielectric layer 960. In FIG. 9E, the conductive layer 955 is etched to form side electrode 950, for example, by a directional or anisotropic etch, to remove the portion of the dielectric layer outside the opening. The anisotropic etch can include a plasma etch, for example, a reactive plasma etch with fluorine, chlorine, or oxygen etchant. After the anisotropic etch, the memory structure can include three electrodes 920, 940, and 950. The electrode 920 is a bottom electrode, disposed under the switching layer 930. The electrode 940 is a top electrode, disposed above the switching layer 930. The electrode 950 is a side electrode, disposed at a side around the switching layer 930. A dielectric layer is used to insulate the side electrode 950 from the top and bottom electrodes.

Figure 10:
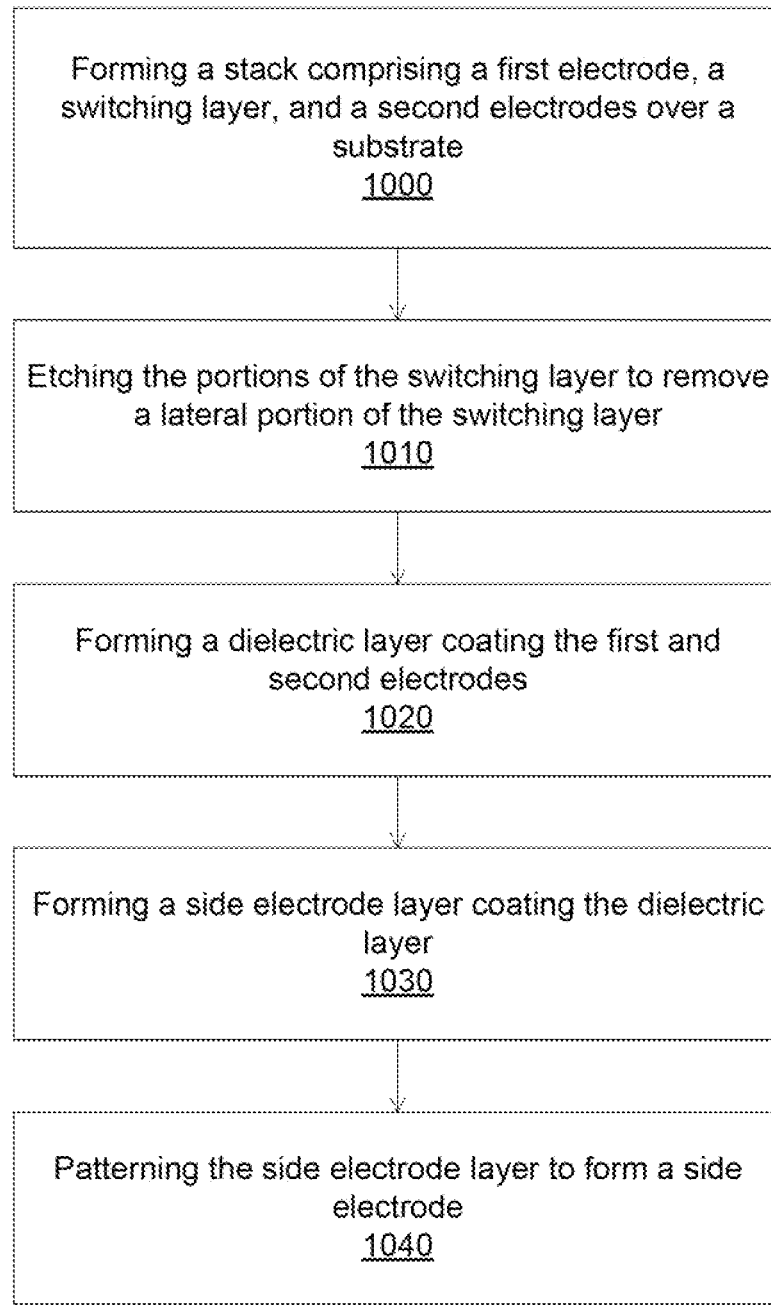
FIG. 10 illustrates another flowchart for forming a memory structure according to some embodiments.

FIG. 10 illustrates another flowchart for forming a memory structure according to some embodiments. In operation 1000, a memory stack can be formed, which can include forming a first insulator or dielectric layer disposed between first and second electrodes. The first dielectric layer can operable as a switching layer, and can include a metal oxide such as hafnium oxide or zirconium oxide. The formation of the memory stack can include a sequential deposition of the first electrode, the dielectric layer, and the second electrode over a substrate, as discussed above.

In operation 1010, the memory stack is etched to remove a portion of the first dielectric layer. The etching process can be an isotropic wet etch to remove a portion of the first dielectric material between the first and second electrodes. The etching process can be a selective etch, which can remove the first dielectric material without affecting or etching the electrodes.

In operation 1020, a second dielectric layer is formed in the removed portion of the first dielectric layer. The formation of the second dielectric layer can be performed by a high conformal deposition process, such as an atomic layer deposition process.

In operation 1030, a side electrode layer is formed over the second dielectric layer. The formation of the side electrode layer can be performed by a high gap fill deposition process, such as an atomic layer deposition process.

In operation 1040, the side electrode layer is etched to form a side electrode, such as an all-around side electrode surrounding the switching layer.

Figure 11A:
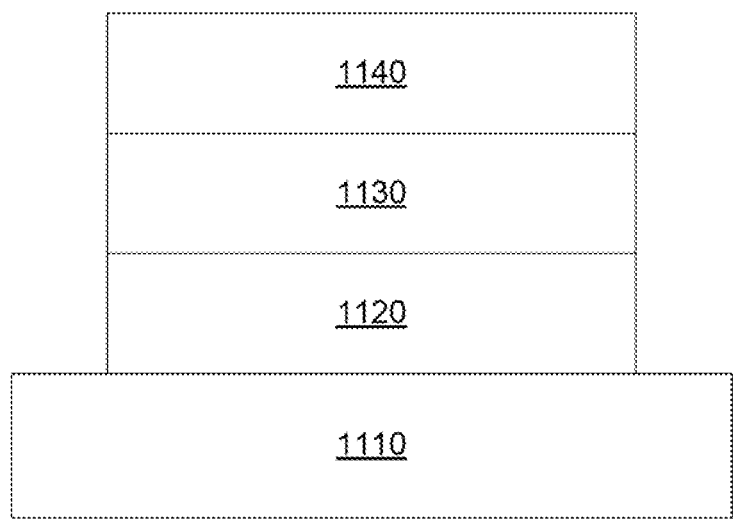
FIGS. 11A-11F illustrate another fabrication process for forming a memory structure having an all-around side electrode according to some embodiments.

FIGS. 11A-11F illustrate another fabrication process for forming a memory structure having an all-around side electrode according to some embodiments. In FIG. 11A, a top electrode 1140 can be formed ever a switching layer 1130, which can be formed over a bottom electrode 1120, which can be formed over a substrate 1110. The switching layer 1130 can be a metal oxide, such as hafnium oxide or zirconium oxide. The switching layer can have embedded defects that can be re-distributed to form conductive filaments. A patterning process can be performed, for example by a photolithography process followed by a etch process, to pattern the memory stack, e.g., the switching layer between the two electrodes. Other process steps and components can be added, for example, a cleaning step and device isolation.

Figure 11B:
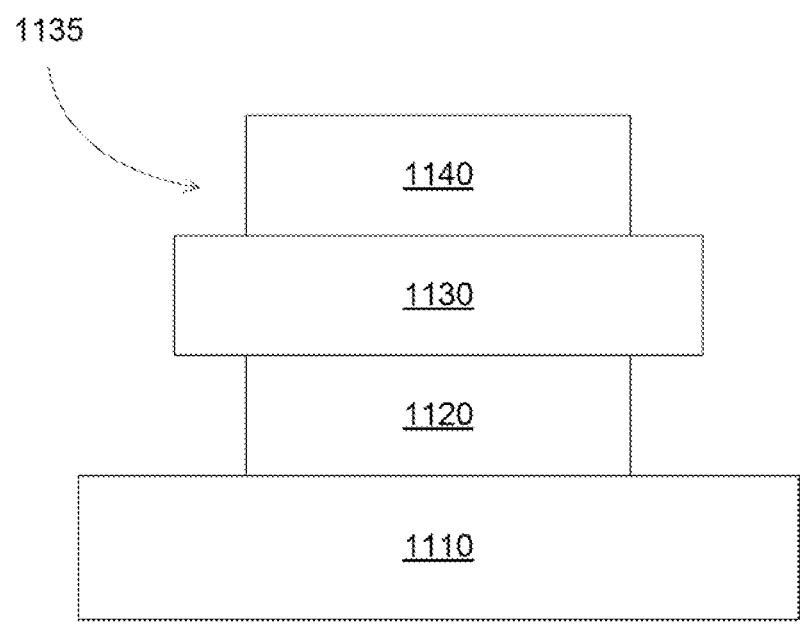

In FIG. 11B, the electrodes are selectively etched. For example, the electrodes can be selectively etched with respect to the switching layer to remove a lateral portion and to form openings 1135 of the two electrodes. The selective etch can be a wet etch, for example, using a solution of nitric acid, HF, HCl, or any combination thereof.

Figure 11C:
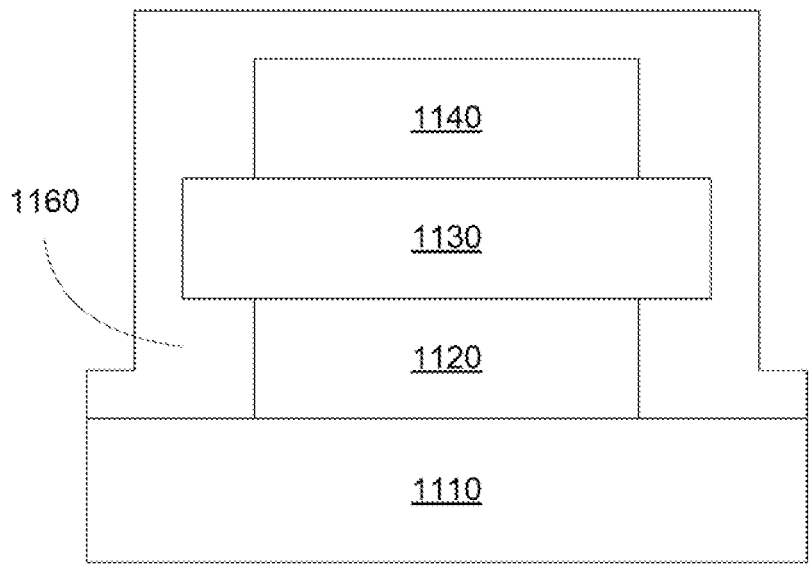

In FIG. 11C, a dielectric layer 1160 is formed, coating the top and bottom electrodes and the switching layer, together with the opening 1135 in the electrodes. The formation of the dielectric layer 1160 can be performed by a deposition process that has good conformal characteristics, such as an atomic layer deposition (ALD) process, to uniformly coating the memory stack. The dielectric layer 1160 can be an insulator layer, such as silicon oxide layer or aluminum oxide layer.

Figure 11D:
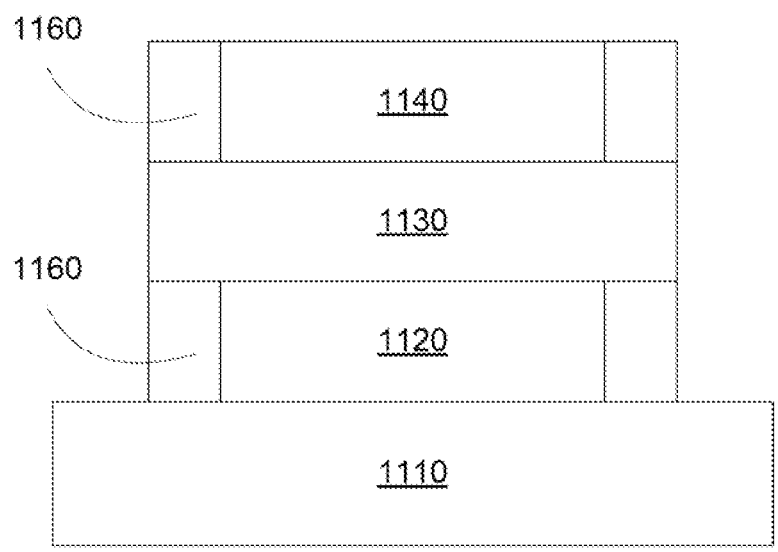

In FIG. 11D, the dielectric layer 1160 is patterned to expose a side surface of the switching layer 1130, such as a surface between the two electrodes 1120 and 1140. The patterning of the protective layer 950 can be performed by a directional etching process, such as a plasma reactive ion etching process.

Figure 11E:
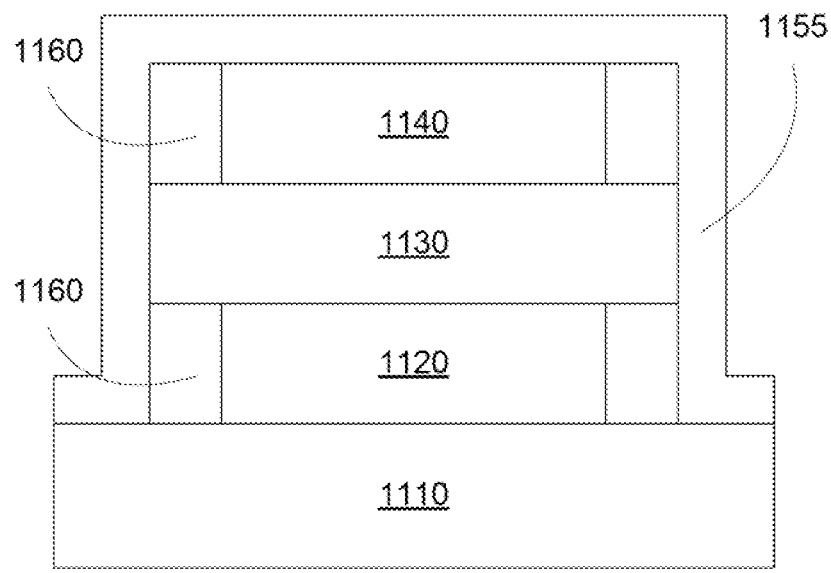
Figure 11F:
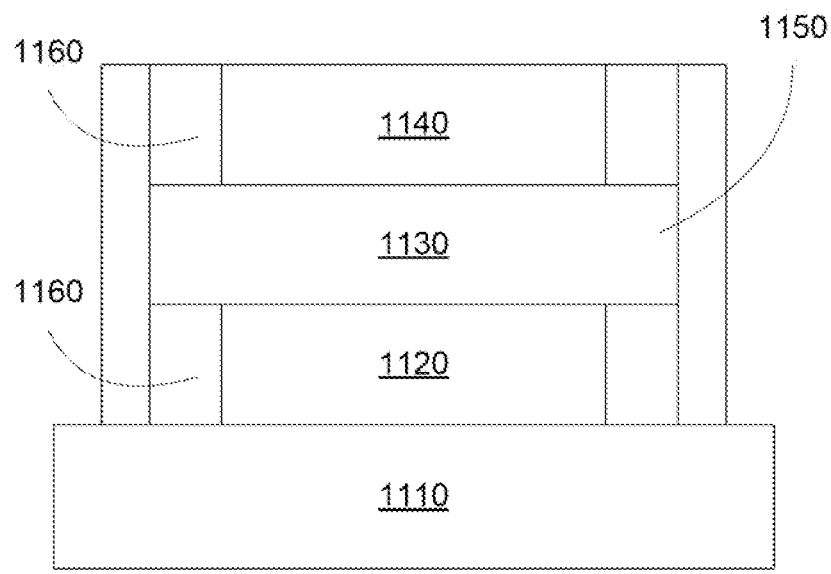

In FIG. 11E, a conductive layer 1155 can be formed over the memory stack, interfacing the exposed surface of the switching layer 1130. In FIG. 11F, the conductive layer 1155 is etched to form side electrode 1150, for example, by a directional or anisotropic etch, to remove the portion of the dielectric layer outside the opening. The anisotropic etch can include a plasma etch, for example, a reactive ion etch with fluorine, chlorine, or oxygen etchant. After the anisotropic etch, the memory structure can include three electrodes 1120, 1140, and 1150. The electrode 1120 is a bottom electrode, disposed under the switching layer 1130. The electrode 1140 is a top electrode, disposed above the switching layer 1130. The electrode 1150 is a side electrode, disposed at a side around the switching layer 1130. A dielectric layer is used to insulate the side electrode 1150 from the top and bottom electrodes.

Figure 12:
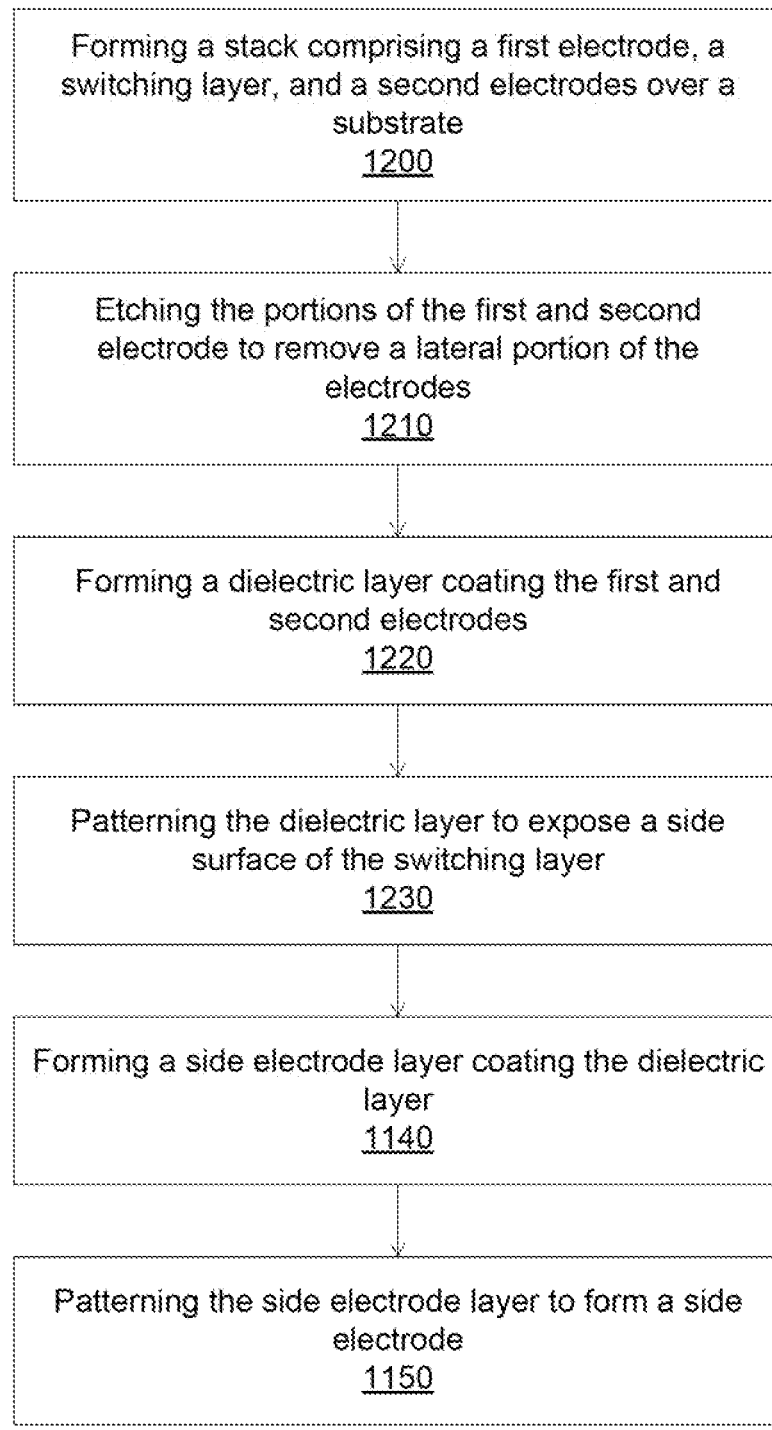
FIG. 12 illustrates another flowchart for forming a memory structure according to some embodiments.

FIG. 12 illustrates another flowchart for forming a memory structure according to some embodiments. In operation 1200, a memory stack can be formed, which can include forming a switching layer disposed between first and second electrodes. The switching layer can include a metal oxide such as hafnium oxide or zirconium oxide. The formation of the memory stack can include a sequential deposition of the first electrode, the switching layer, and the second electrode over a substrate, as discussed above.

In operation 1210, the memory stack can be etched to remove a portion of the first and second electrodes. The etching process can be an isotropic wet etch to remove a portion of the first electrode and a portion of the second electrode. The etching process can be a selective etch, which can remove the electrode material without affecting or etching the switching layer.

In operation 1220, a dielectric layer is formed in the removed portion of the electrodes. The formation of the dielectric layer can be performed by a high conformal deposition process, such as an atomic layer deposition process.

In operation 1230, the dielectric layer is patterned to expose a portion of the switching layer, such as a side surface of the switching layer. The patterning process can be an anisotropic etch, such as a plasma reactive ion etch, to remove a top portion, and a side portion of the dielectric layer, while leaving a side portion at the electrodes.

In operation 1240, a side electrode layer is formed over the dielectric layer. The formation of the side electrode layer can be performed by a high gap fill deposition process, such as an atomic layer deposition process.

In operation 1250, the side electrode layer is etched to form a side electrode, such as an all-around side electrode surrounding the switching layer.

In some embodiments, the ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 13:
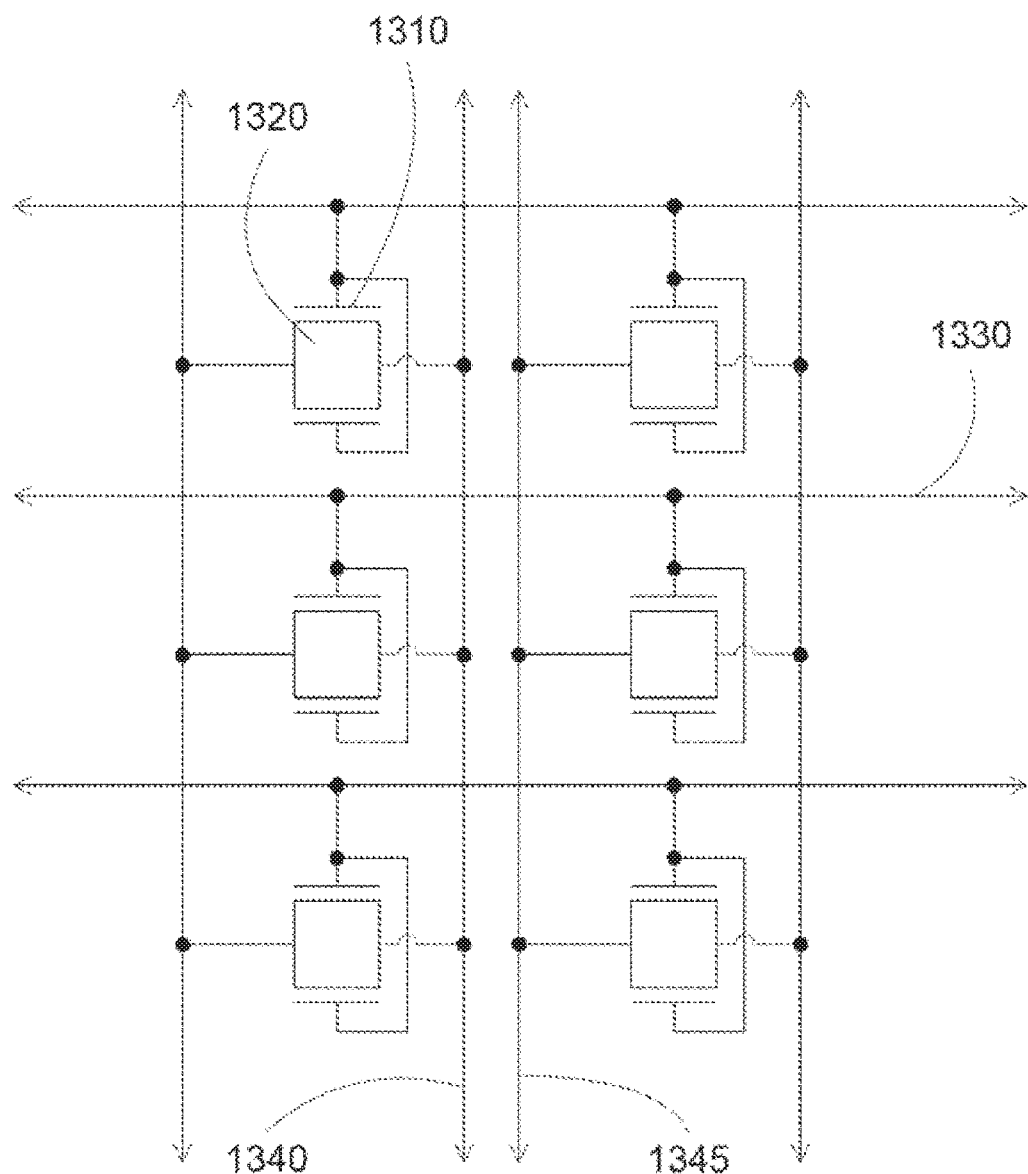
FIG. 13 illustrates a cross point memory array according to some embodiments.

FIG. 13 illustrates a cross point memory array according to some embodiments. The memory array may be part of a memory device or other integrated circuit. The memory array is an example of potential memory configurations; it is understood that several other configurations are possible.

A switching memory device 1320 can include a switching layer and a current selector, which are both disposed between two electrodes. The switching layer can interface a side electrode 1310. Read and write circuitry may be connected to memory devices 1320 using signal lines 1340 and orthogonal signal lines 1345. Signal lines such as signal lines 1340 and signal lines 1345 are sometimes referred to as word lines and bit lines and are used to read data into the memory devices 1320 of the memory array. Also, signal lines 1340 and 1345 can be used to apply forming voltage or reading voltage to the memory structures 1320.

Signal lines 1330 can be included to control the side electrodes. Signal lines 1330 can be used to write data, e.g., set and reset operation, to the memory devices 1320. During the operation of the cross point memory array, such as a read operation, the state of a memory device 1320 can be sensed by applying a sensing voltage (i.e., a "read" voltage) to an appropriate set of signal lines 1340 and 1345. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, e.g., a set or reset operation, the state of a memory device 1320 can be changed by application of suitable write signals to an appropriate set of signal lines 1330, leaving the signal lines 1340 and 1345 floated. Write operation can also include grounding the signal lines 1340 and 1345.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A resistive switching memory structure comprising:
a substrate;

a resistive switching layer,
wherein the resistive switching layer has a bottom surface facing the substrate, a top surface opposite the bottom surface, and a side surface;
a first electrode facing the bottom surface of the resistive switching layer;
a second electrode facing the top surface of the resistive switching layer;
a third electrode directly interfacing the side surface of the resistive switching layer; and
a current limiter element disposed between either the first electrode and the bottom surface of the resistive switching layer or between the second electrode and the top surface of the resistive switching layer.

2. A resistive switching memory structure as in claim 1 wherein the resistive switching layer comprises a metal oxide material.

3. A resistive switching memory structure as in claim 1 wherein the first electrode directly interfaces the top surface of the resistive switching layer or the second electrode directly interfaces the bottom surface of the resistive switching layer.

4. A resistive switching memory structure as in claim 1 wherein the current limiter element is disposed between the first electrode and the bottom surface of the resistive switching layer.

5. A resistive switching memory structure as in claim 1 wherein the current limiter element is disposed between the second electrode and the top surface of the resistive switching layer.

6. A resistive switching memory structure as in claim 1 wherein the third electrode directly interfaces the resistive switching layer at two opposite sides or at all sides around the resistive switching layer.

7. A resistive switching memory structure as in claim 1 wherein the third electrode is separated from the first electrode or from the second electrode by an insulator layer.

8. A resistive switching memory structure as in claim 1 wherein a lateral dimension of the resistive switching layer is smaller than a lateral dimension of the first electrode or a lateral dimension of the second electrode.

9. A resistive switching memory structure as in claim 1 wherein the resistive switching layer comprises a vertical interface, wherein the vertical interface is disposed in a middle of the resistive switching layer and connects the top surface and the bottom surface of the resistive switching layer.

10. A method for forming a resistive switching memory structure, the method comprising:
providing a substrate;
forming a resistive switching layer above the substrate;
forming a first electrode under the resistive switching layer and facing a bottom surface of the resistive switching layer;
forming a second electrode above the resistive switching layer and facing a top surface of the resistive switching layer;
forming a third electrode,
wherein the third electrode directly interfaces a side surface of the resistive switching layer; and
forming a current limiter element,
wherein the current limiter element is disposed between either the first electrode and the bottom surface of the resistive switching layer or between the second electrode and the top surface of the resistive switching layer.

11. A method as in claim 10 wherein the resistive switching layer comprises at least two portions, wherein the two portions comprise an interface linking the first electrode and the second electrode.

12. A method as in claim 10 wherein the resistive switching layer is formed above the first electrode.

13. A method as in claim 10 wherein forming the third electrode comprises:
forming an insulating layer on side surfaces of the first and second electrodes; and
forming the third electrode interfacing a side surface of the insulating layer.

14. A method as in claim 10 wherein forming the third electrode comprises
removing a portion of the resistive switching layer between the first electrode and the second electrode; and
forming the third electrode within the removed portion of the resistive switching layer.

15. A method as in claim 10 further comprising forming interconnects for the first electrode, the second electrode, and the third electrode.

16. A method as in claim 10 wherein the current limiter element is disposed between the first electrode and the bottom surface of the resistive switching layer.

17. A method as in claim 10 wherein the current limiter element is disposed between the second electrode and the top surface of the resistive switching layer.

18. A method as in claim 13 wherein the insulating layer is disposed between the resistive switching layer and the third electrode.

19. A method as in claim 13 wherein the insulating layer comprises one of silicon oxide or aluminum oxide.

20. A method as in claim 13 wherein the insulating layer has a thickness of less than 50% of a thickness of the resistive switching layer.

* * * * *